United States Patent
Hamaguchi et al.

(10) Patent No.: US 8,999,738 B2
(45) Date of Patent: Apr. 7, 2015

(54) METHOD FOR MANUFACTURING ORGANIC ELECTROLUMINESCENT DISPLAY APPARATUS

(71) Applicant: Canon Kabushiki Kaisha, Tokyo (JP)

(72) Inventors: Atsushi Hamaguchi, Yokohama (JP); Jun Kamatani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 105 days.

(21) Appl. No.: 13/920,428

(22) Filed: Jun. 18, 2013

(65) Prior Publication Data

US 2014/0004640 A1    Jan. 2, 2014

(30) Foreign Application Priority Data

Jun. 29, 2012    (JP) ................. 2012-147950

(51) Int. Cl.
  *H01L 21/00*    (2006.01)
  *H01L 51/00*    (2006.01)
  *H01L 51/56*    (2006.01)

(52) U.S. Cl.
  CPC .......... *H01L 51/0052* (2013.01); *H01L 51/001* (2013.01); *H01L 51/56* (2013.01); *H01L 51/0056* (2013.01)

(58) Field of Classification Search
  CPC ................. H01L 31/022425; H01L 31/02168; H01L 27/1422; H01J 2237/31711; H01J 37/3171; Y10S 438/928
  See application file for complete search history.

(56) References Cited

U.S. PATENT DOCUMENTS

| 2007/0154733 A1* | 7/2007 | Fukuoka et al. ............... 428/690 |
| 2010/0157131 A1* | 6/2010 | Kamatani et al. ........ 348/333.11 |
| 2011/0260151 A1 | 10/2011 | Hashimoto et al. |
| 2014/0299855 A1* | 10/2014 | Yomogita et al. ............... 257/40 |

FOREIGN PATENT DOCUMENTS

| JP | 4507759 B2 | 5/2010 |
| JP | 2010-150236 A | 7/2010 |
| WO | 2010/061952 A1 | 6/2010 |

* cited by examiner

*Primary Examiner* — Zandra Smith
*Assistant Examiner* — Andre' C Stevenson
(74) *Attorney, Agent, or Firm* — Fitzpatrick, Cella, Harper & Scinto

(57) ABSTRACT

A method for manufacturing an organic electroluminescent display apparatus including a plurality of organic electroluminescent devices at least containing a fused ring compound having an anthracene skeleton, includes, in the following order: forming an organic electroluminescent layer on a substrate on which a first electrode has been formed; processing the organic electroluminescent layer; forming a second electrode on the organic electroluminescent layer; and providing a sealing member covering the organic electroluminescent layer, in which the organic electroluminescent layer is not exposed to an environment containing oxygen and including light of a wavelength shorter than a wavelength of a long wavelength edge of an absorption spectrum of the fused ring compound having an anthracene skeleton from forming the organic electroluminescent layer until completion of providing the sealing member.

10 Claims, 4 Drawing Sheets

METHOD FOR MANUFACTURING ORGANIC ELECTROLUMINESCENT DISPLAY APPARATUS

BACKGROUND OF THE INVENTION

1. Field of the Invention

The present invention relates to a method for manufacturing an organic electroluminescent display apparatus.

2. Description of the Related Art

An organic electroluminescent display apparatus is a display including a plurality of organic electroluminescent devices. Since organic electroluminescent display apparatuses have high contrast and can be easily manufactured in a small thickness, these display apparatuses have attracted attentions as a promising candidate of a flat panel display. The organic electroluminescent display apparatuses also have an advantage that the response speed thereof is higher than that of a liquid crystal display and hence the organic electroluminescent display apparatuses are suitable for displaying dynamic images.

In a display region of an organic electroluminescent display apparatus, for example, subpixels each including an organic electroluminescent device for outputting any one of red, green and blue lights are arranged two-dimensionally and with high definition. Furthermore, by controlling the quantity of light emitted from each of the subpixels, a desired full color image can be displayed.

As a method for manufacturing a display apparatus including organic electroluminescent devices with high definition, various methods have been proposed. Japanese Patent No. 4507759 discloses a method for forming a layer of an organic material (an organic material layer) constructing an organic electroluminescent device into a desired pattern shape with good patterning accuracy. Specifically, a mask layer is formed on an organic material layer by photolithography process, so as to pattern the organic material layer by using the mask layer. The mask layer is formed by successively forming an intermediate layer containing a light absorption material and made of alcohol-soluble nylon and a resist layer, and processing a layered body of the intermediate layer and the resist layer by the photolithography process. Here, the light absorption material contained in the intermediate layer is provided for the purpose of preventing damage of the organic material layer caused by exposing light.

On the other hand, various organic compounds have been proposed for the purpose of improving efficiency and durability of organic electroluminescent devices. Japanese Patent Application Laid-Open No. 2010-150236 discloses a fused polycyclic compound having an anthracene skeleton represented by the following general formula:

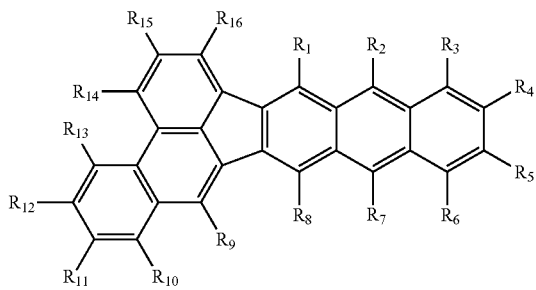

wherein $R_1$ to $R_{16}$ each represent a hydrogen atom, a halogen atom, an alkyl group having 1 to 20 carbon atoms, a substituted amino group, an aryl group that may have a substituent or a heterocyclic group that may have a substituent. However, at least one of $R_1$ to $R_{16}$ is a halogen atom, an alkyl group having 1 to 20 carbon atoms, a substituted amino group, an aryl group that may have a substituent or a heterocyclic group that may have a substituent.

SUMMARY OF THE INVENTION

In order to obtain a display apparatus with high definition, high efficiency and high durability, the patterning method disclosed in Japanese Patent No. 4507759 may be applied to an organic electroluminescent material having an anthracene skeleton as disclosed in Japanese Patent Application Laid-Open No. 2010-150236. When the organic electroluminescent material having an anthracene skeleton is exposed to light having higher energy than singlet excitation energy under an atmosphere containing oxygen, however, the organic electroluminescent material is degraded through photodimerization. Although Japanese Patent No. 4507759 makes no detailed description, there is a possibility that some steps such as a step of transporting a substrate to a photolithography apparatus after forming the organic compound layer and a step of removing the intermediate layer by dipping the intermediate layer in water are carried out in the atmosphere under an environment where the spectrum of ambient light is not restricted, for example, under light from a white luminescent lamp. In such a case, there arises a problem in which the organic electroluminescent material having an anthracene skeleton is degraded so that the manufactured device may be inferior in luminous efficiency and durability characteristics to a device manufactured by vacuum evaporation.

The present invention was achieved for solving the aforementioned problems, and an object of the present invention is to provide an organic electroluminescent apparatus having high definition, high efficiency and a long life.

The method for manufacturing an organic electroluminescent display apparatus of the present invention is a method for manufacturing an organic electroluminescent apparatus that includes, on a substrate, a plurality of organic electroluminescent devices each including a first electrode, a second electrode and an organic compound layer sandwiched between the first electrode and the second electrode and containing a fused ring compound having an anthracene skeleton, with the organic electroluminescent devices covered by a sealing member, including, in the following order: forming the organic compound layer on the substrate on which the first electrode has been formed; processing the organic compound layer; forming the second electrode on the organic compound layer; and providing the sealing member covering the organic compound layer, wherein the organic compound layer is not exposed to an environment containing oxygen and including light of a wavelength shorter than a wavelength of a long wavelength edge of an absorption spectrum of the fused ring compound having an anthracene skeleton from forming the organic compound layer until completion of providing the sealing member.

Further features of the present invention will become apparent from the following description of exemplary embodiments with reference to the attached drawings.

DESCRIPTION OF THE EMBODIMENTS

Figure 1:
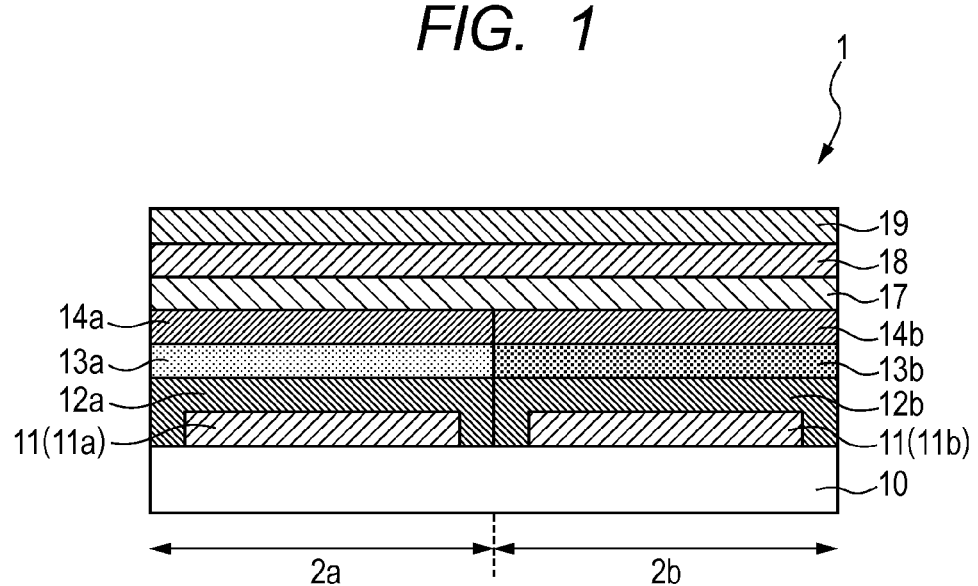
FIG. 1 is a schematic cross-sectional view illustrating an example of an organic electroluminescent apparatus manufactured by a manufacturing method of the present invention.

Preferred embodiments of the present invention will now be described in detail in accordance with the accompanying drawings.

A method for manufacturing an organic electroluminescent display apparatus of the present invention is a method for manufacturing an organic electroluminescent display apparatus including organic electroluminescent devices including an organic electroluminescent layer containing a first organic electroluminescent material, that is, a fused ring compound having an anthracene skeleton. An organic electroluminescent layer may contain, in addition to the first organic electroluminescent material, a second organic electroluminescent material not having an anthracene skeleton.

The method for manufacturing an organic electroluminescent display apparatus of the present invention typically includes at least following steps (1) to (3):

(1) A step of forming an organic electroluminescent layer containing a first organic electroluminescent material;

(2) a transporting step; and (3) a step of processing the organic electroluminescent layer.

In the present invention, the step (2) (the transporting step) is typically a step of transportation, performed after forming the organic electroluminescent layer in the step (1) (the step of forming an organic electroluminescent layer), to a processing apparatus for the organic electroluminescent layer for performing the step (3). The step (2) is performed in the atmosphere under ambient light, and at this point, the spectrum of the ambient light is restricted so that the organic electroluminescent layer may not be exposed to light with higher energy than singlet excitation energy of the first organic electroluminescent material.

The step (3) (the step of processing the organic electroluminescent layer) is a processing step in which the organic electroluminescent layer is patterned and an intermediate layer is removed after forming a mask pattern on the organic electroluminescent layer by photolithography. Also in the step (3), the organic electroluminescent layer is exposed in the atmosphere to the ambient light, and the spectrum of the ambient light is restricted at this point so that the organic electroluminescent layer may not be exposed to light with higher energy than the singlet excitation energy of the first organic electroluminescent material. In other words, a short wavelength edge of the spectrum of the ambient light to which the first organic electroluminescent material is exposed in the steps (2) and (3) has a longer wavelength than a long wavelength edge of an absorption spectrum of the first organic electroluminescent material.

Incidentally, in the present invention, the organic electroluminescent layer is typically a single layer or a layered body including a plurality of layers to be processed by the photolithography, and corresponds to a layer constructing an organic electroluminescent device.

Now, an embodiment of the present invention will be specifically described with reference to the accompanying drawings. It is noted that common techniques or known techniques of the related art can be applied to matters not especially illustrated in the drawings or not especially mentioned in the following description.

(Organic Electroluminescent Device)

FIG. 1 is a schematic cross-sectional view illustrating an example of an organic electroluminescent apparatus manufactured by the manufacturing method of the present invention. The organic electroluminescent apparatus 1 of FIG. 1 includes two kinds of subpixels, namely, a first subpixel 2a and a second subpixel 2b, provided on a substrate 10. In the organic electroluminescent apparatus 1 of FIG. 1, the first subpixel 2a has an organic electroluminescent device including a lower electrode 11a provided on the substrate 10, a charge injection transport layer 12a, a first light emitting layer 13a, an adjacent functional layer 14a, an electron transport layer 17, an electron injection layer 18 and an upper electrode 19 provided in this order.

In the organic electroluminescent apparatus 1 of FIG. 1, the second subpixel 2b has an organic electroluminescent device including a lower electrode 11b provided on the substrate 10, a charge injection transport layer 12b, a second light emitting layer 13b, an adjacent functional layer 14b, an electron transport layer 17, an electron injection layer 18 and an upper electrode 19 provided in this order. The charge injection transport layers 12a and 12b and the adjacent functional layers 14a and 14b may be respectively made of the same material or different materials. Hereinafter, if these layers are referred to regardless of the first subpixel 2a and the second subpixel 2b, reference signs with "a" and "b" omitted are used for the description like a charge injection transport layer 12 and an adjacent functional layer 14.

(Method for Manufacturing Organic Electroluminescent Apparatus)

The present invention typically relates to a method for manufacturing an organic electroluminescent display apparatus, comprising a step of forming on the substrate an organic electroluminescent layer patterned into a desired shape by the photolithography, and a step where the organic electroluminescent layer on the substrate can be exposed to ambient light in the atmosphere in the course of manufacturing the organic electroluminescent display apparatus. Accordingly, the present invention is applicable to any manufacturing process including a step where the organic electroluminescent layer on the substrate can be exposed to ambient light in the atmosphere in the course of manufacturing the organic electroluminescent display apparatus. A specific example of the manufacturing process of the present invention will now be described, but it is noted that the present invention is not limited to this specific example.

Figure 2A:
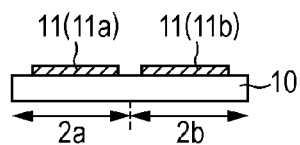
FIGS. 2A, 2B, 2C, 2D, 2E, 2F, 2G, 2H, 2I, 2J, 2K, 2L, 2M and 2N are schematic cross-sectional views illustrating exemplary embodiments attained in the method for manufacturing an organic electroluminescent apparatus of the present invention.
Figure 2B:
Figure 2C:
Figure 2D:
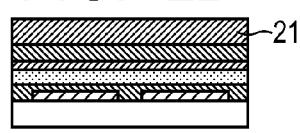
Figure 2E:
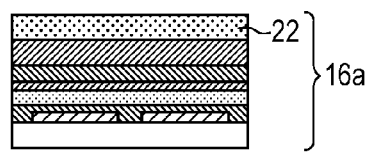
Figure 2F:
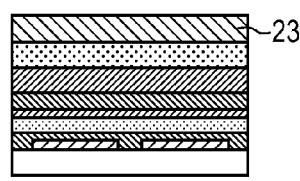
Figure 2G:
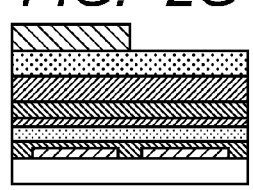
Figure 2H:
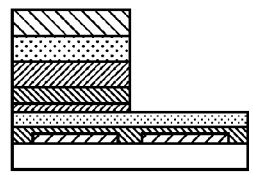
Figure 2I:
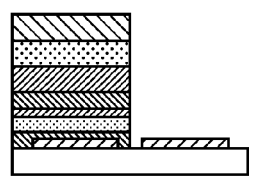
Figure 2J:
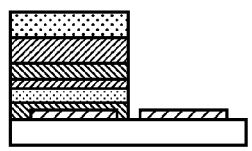
Figure 2K:
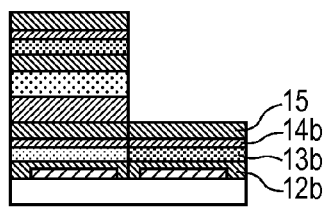
Figure 2L:
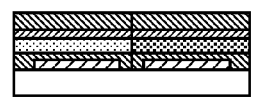
Figure 2M:
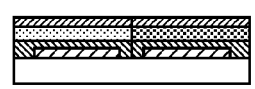
Figure 2N:

FIGS. 2A to 2N are schematic cross-sectional views illustrating exemplified embodiments attained in the method for manufacturing an organic electroluminescent apparatus of the present invention. FIGS. 2A to 2N illustrate the manufacturing process for an organic electroluminescent apparatus having two kinds of subpixels (2a and 2b) different from each other in color of light emission, but the present invention is not limited to such an apparatus. For example, the number of kinds of subpixels may be three or more. Incidentally, in an actual organic electroluminescent apparatus, pixels (each corresponding to a minimum unit for forming an image) each including a combination of two kinds of subpixels (2a and 2b) are two-dimensionally provided on a substrate 10. Now, the manufacturing method of the present invention will be described based on FIGS. 2A to 2N.

(1) Step of manufacturing substrate having lower electrode (FIG. 2A)

First, a plurality of lower electrodes 11 are formed on a substrate 10 (FIG. 2A). As the substrate 10, for example, an insulating substrate such as a glass substrate, a Si wafer or the like is used. Although not illustrated in FIG. 2A, a drive circuit including a transistor or the like for driving the organic electroluminescent apparatus may be provided in the substrate 10 if necessary. If a drive circuit (not shown) is provided in the substrate 10, a planarizing layer (not shown) for planarizing irregularities caused by providing the drive circuit can be provided.

A material for the lower electrode 11 may be appropriately selected according to a light extraction direction. For example, a conductive metal material such as Al or Ag may be used for forming the lower electrode 11 as a reflecting electrode, or a transparent electrode material such as ITO or zinc oxide containing tin may be used for forming the lower electrode 11 as an optically transparent electrode. In the case where the lower electrode 11 is formed as a reflecting electrode, an electrode including an electrode layer made of a conductive metal material and an electrode layer made of a transparent electrode material stacked in this order may be used.

If the respective organic electroluminescent devices are individually operated to emit light from each subpixel, the lower electrode 11 is patterned into a desired shape, so as to be divided correspondingly to each subpixel. As a method for patterning the lower electrode 11, a known method such as the photolithography process may be applied. After patterning the lower electrode 11 into a desired shape so as to isolate respective electrodes, a pixel isolation film for partitioning light emitting regions of the respective subpixels may be provided if necessary.

(2) Step of forming charge injection transport layer (FIG. 2B)

Next, a charge injection transport layer 12a and a first light emitting layer 13a constructing an organic electroluminescent device included in a first subpixel 2a are successively formed over the substrate 10 (FIG. 2B).

Incidentally, the charge injection transport layer 12 is not always necessary. If the charge injection transport layer 12 is provided, the charge injection transport layer 12 may be made of a single layer or a plurality of layers.

If the lower electrode 11 is a positive electrode, the charge injection transport layer 12 includes a hole injection layer, a hole transport layer, an electron blocking layer and the like. Alternatively, if the lower electrode 11 is a negative electrode, the charge injection transport layer 12 includes an electron injection layer, an electron transport layer, a hole blocking layer and the like.

As a material for the first light emitting layer 13a, any of known low molecular materials or high molecular materials can be selected. As a method for forming the first light emitting layer 13a, a vacuum evaporation method, a coating method or the like can be employed.

In the present invention, the organic electroluminescent layer includes a first organic electroluminescent material. More specifically, in this embodiment, at least any one of the charge injection transport layer 12, the light emitting layer (the first light emitting layer 13a) and the adjacent functional layer 14 includes a first organic electroluminescent material. A second organic electroluminescent material may be further included. Here, the first organic electroluminescent material and the second organic electroluminescent material are materials described below.

(2a) First Organic Electroluminescent Material

The first organic electroluminescent material is a fused ring compound having an anthracene skeleton. Examples of the fused ring compound having an anthracene skeleton include compounds represented by the following Formulas (a) to (g):

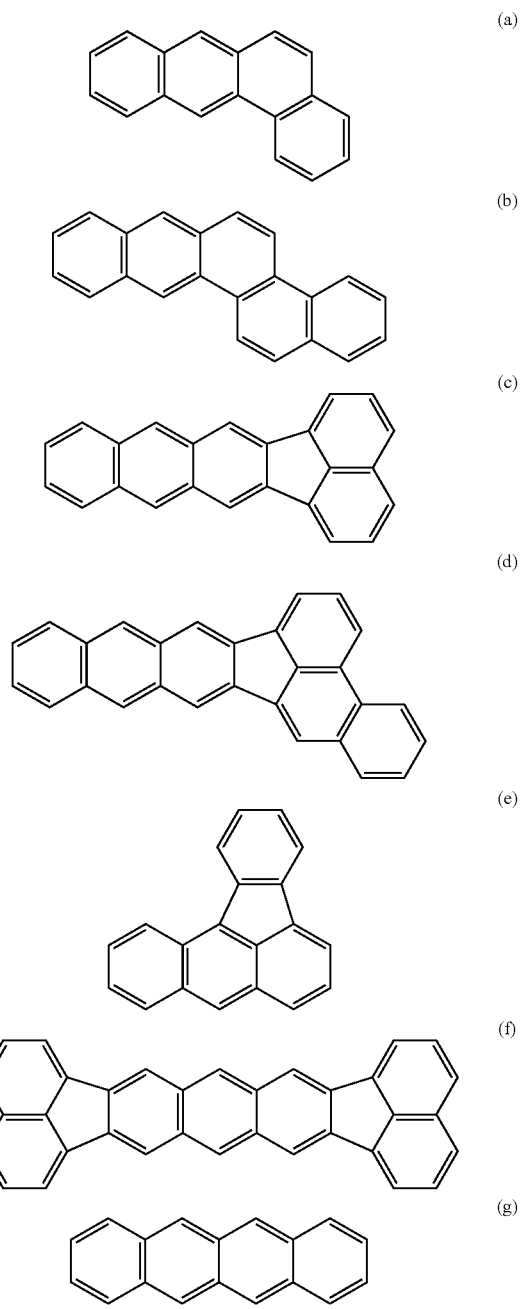

In Formulas (a) to (g), a hydrogen atom may be substituted with any one of a fluorine atom, a chlorine atom, a bromine atom, an iodine atom, an alkyl group having 1 to 20 carbon atoms, a substituted amino group, an aryl group that may have a substituent and a heterocyclic group that may have a substituent. However, at least one of the hydrogen atoms can be substituted with a halogen atom, an alkyl group having 1 to 20 carbon atoms, a substituted amino group, an aryl group that may have a substituent or a heterocyclic group that may have a substituent.

Examples of the alkyl group used for substituting a hydrogen atom include a methyl group, an ethyl group, an n-propyl group, an iso-propyl group, an n-butyl group, a sec-butyl group, an iso-butyl group, a tert-butyl group and an n-hexyl group.

Examples of the substituted amino group used for substituting a hydrogen atom include a dimethylamino group and a diphenylamino group.

An example of the aryl group used for substituting a hydrogen atom includes a phenyl group.

An example of the heterocyclic group used for substituting a hydrogen atom includes a pyridyl group.

The first organic electroluminescent material may be contained in the organic electroluminescent layer formed in the first subpixel 2a or the second subpixel 2b or in the organic electroluminescent layers formed in both the subpixels. In the following description, an exemplary case in which the first organic electroluminescent material is contained in the organic electroluminescent layer formed in the first subpixel 2a is assumed.

Specific examples of the first organic electroluminescent material include the following compounds. It is, however, noted that compounds usable as the first organic electroluminescent material in the present invention are not limited to the following group of compounds.

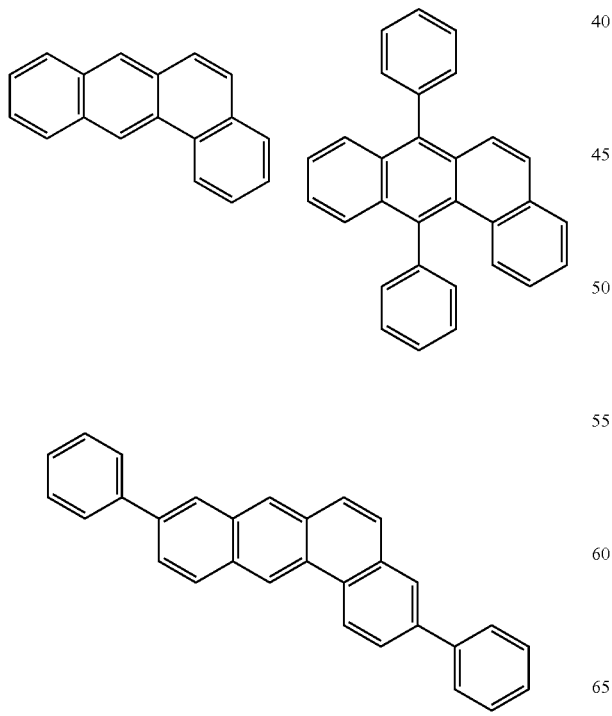

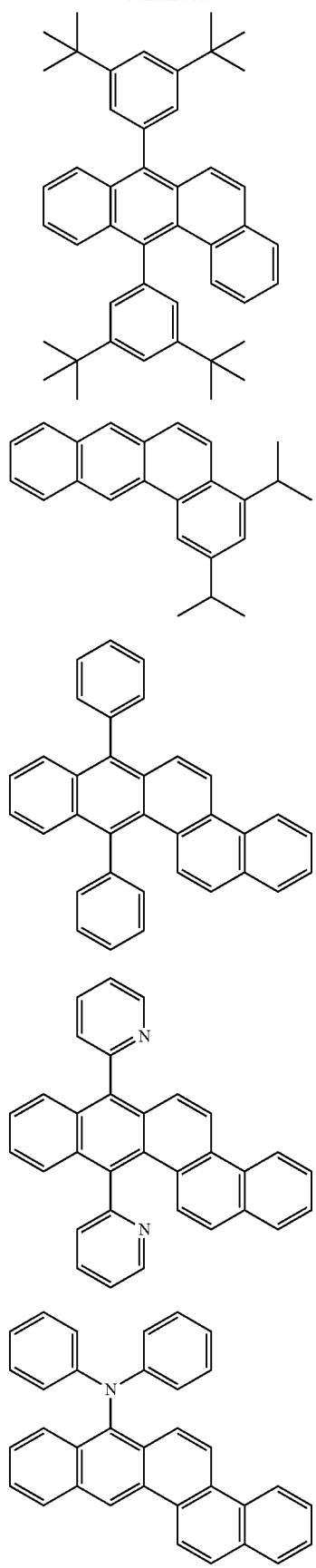

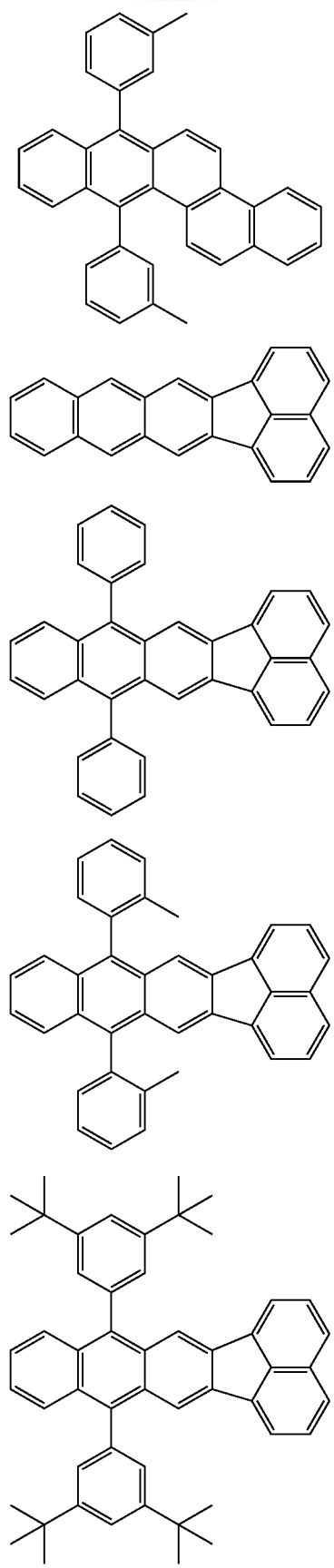

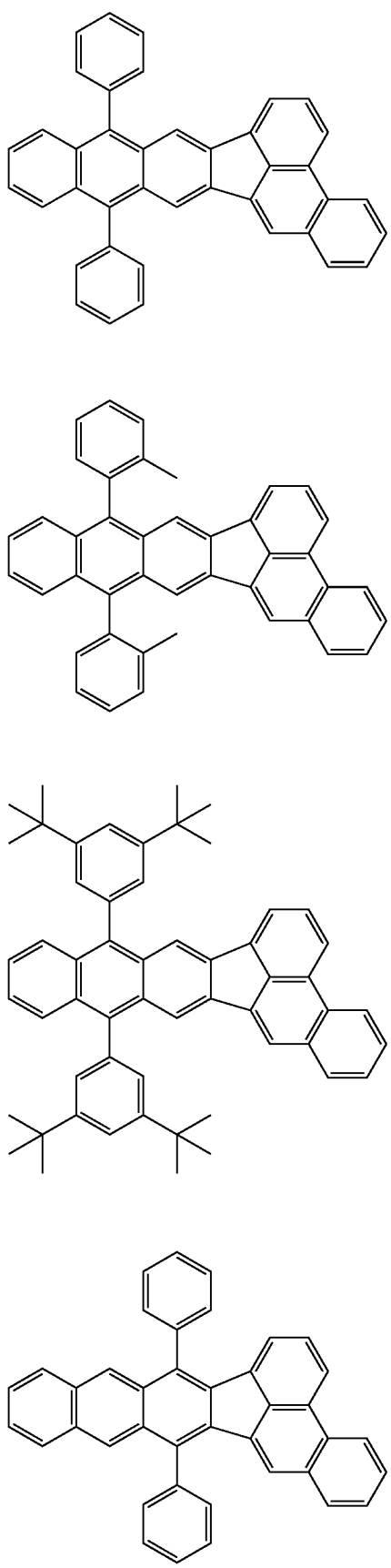
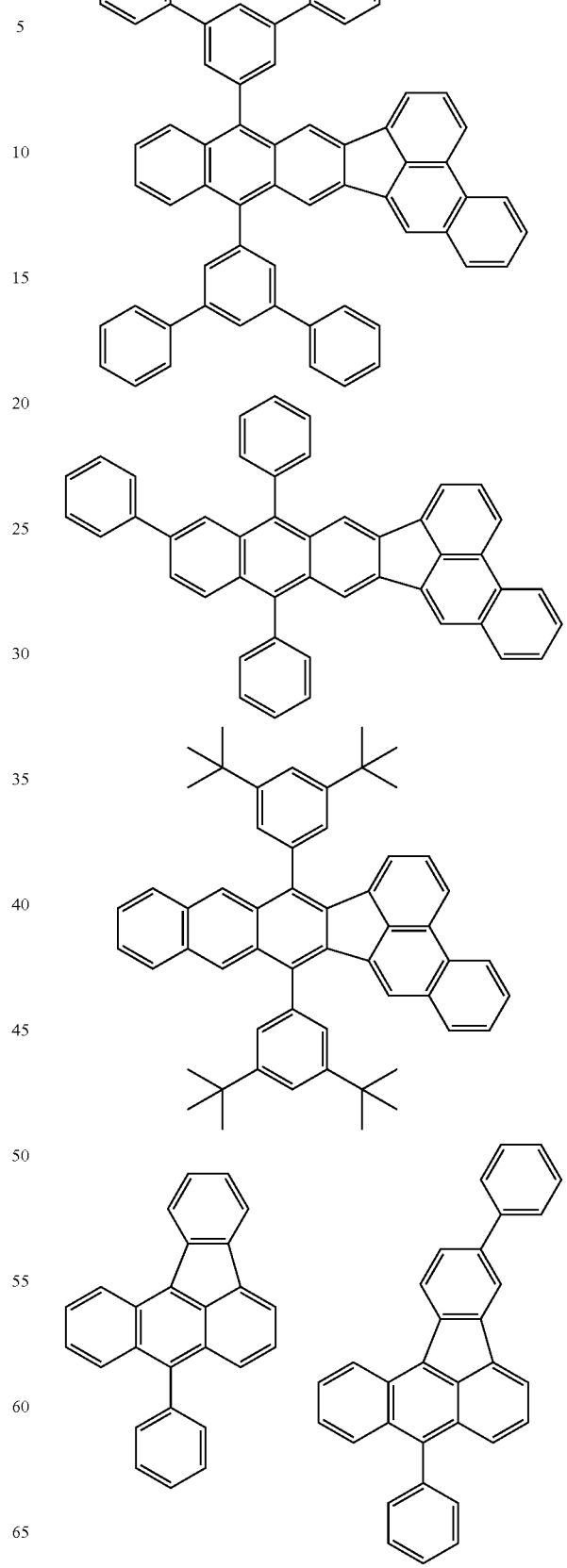

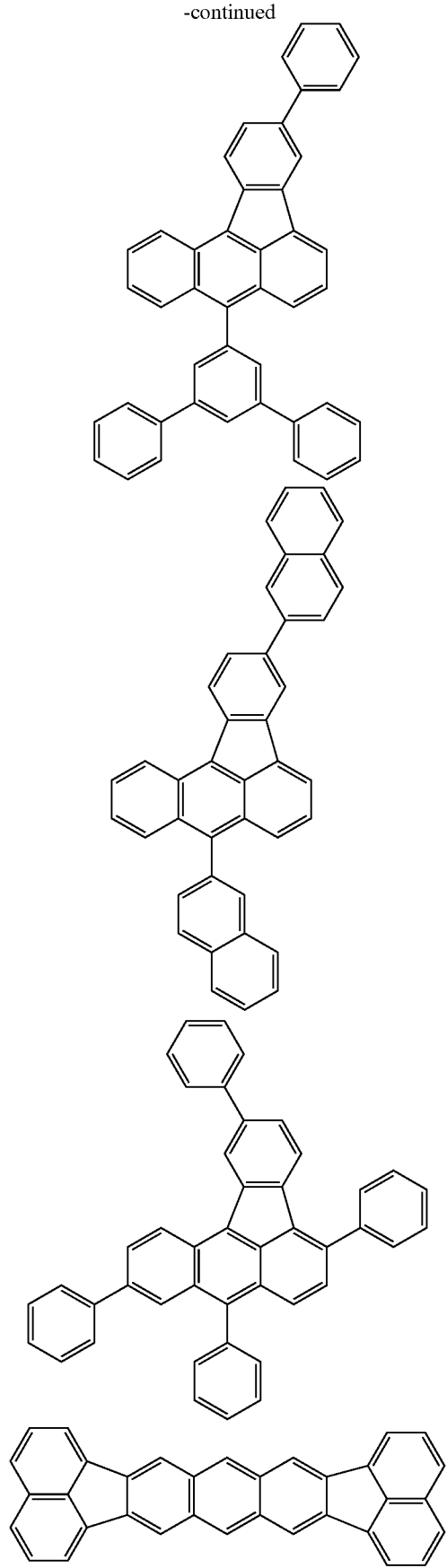
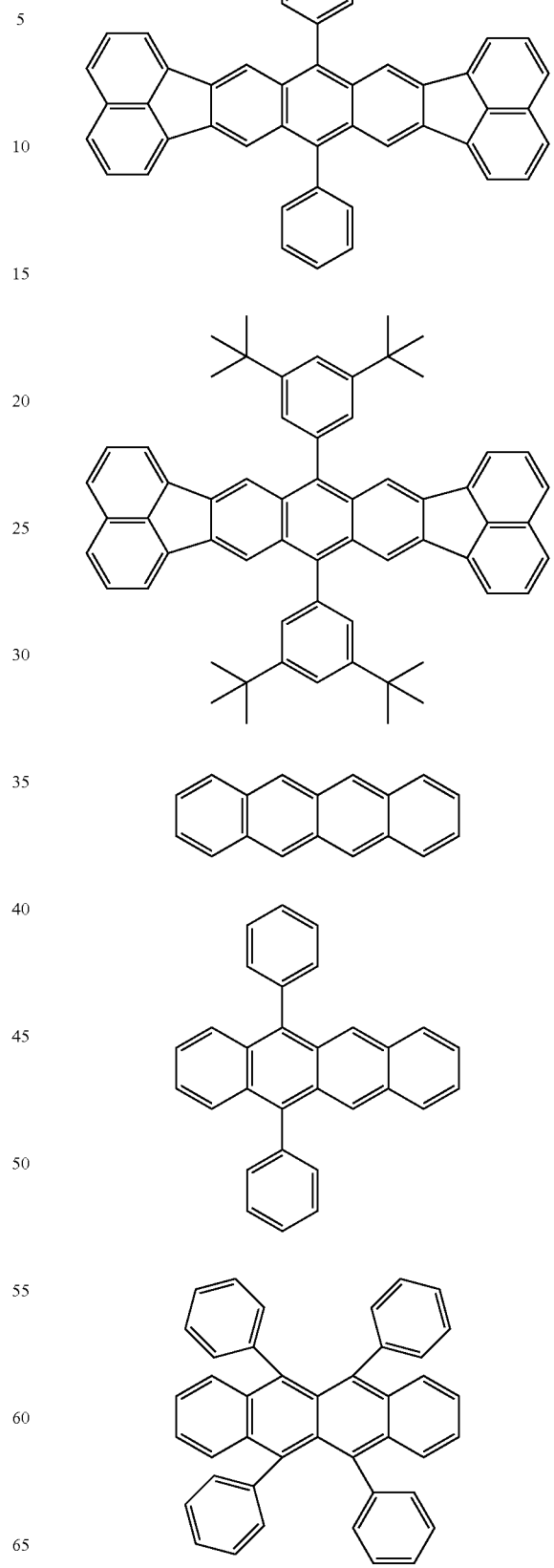

-continued

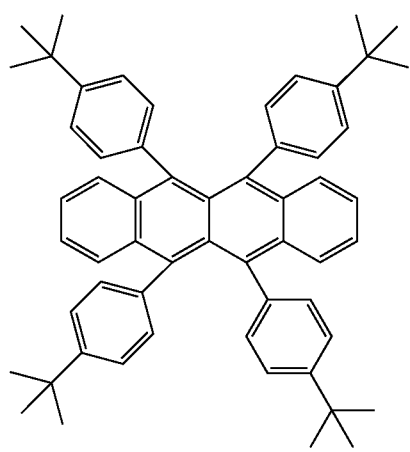

(2b) Second Organic Electroluminescent Material

The organic electroluminescent layer may further contain the second organic electroluminescent material not having an anthracene skeleton. Compounds to be used as the second organic electroluminescent material are not especially limited, but the second organic electroluminescent material preferably has an absorption spectrum not overlapping the spectrum of the ambient light. Specifically, the spectrum of the ambient light can preferably be restricted so as to overlap neither the absorption spectrum of the first organic electroluminescent material nor the absorption spectrum of the second organic electroluminescent material. This is because the first organic electroluminescent material and the second organic electroluminescent material can be thus prevented from being excited by the ambient light.

Specific examples of the second organic electroluminescent material include the following compounds, but the present invention is not limited to these compounds.

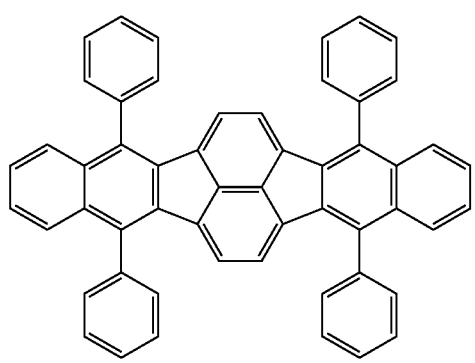

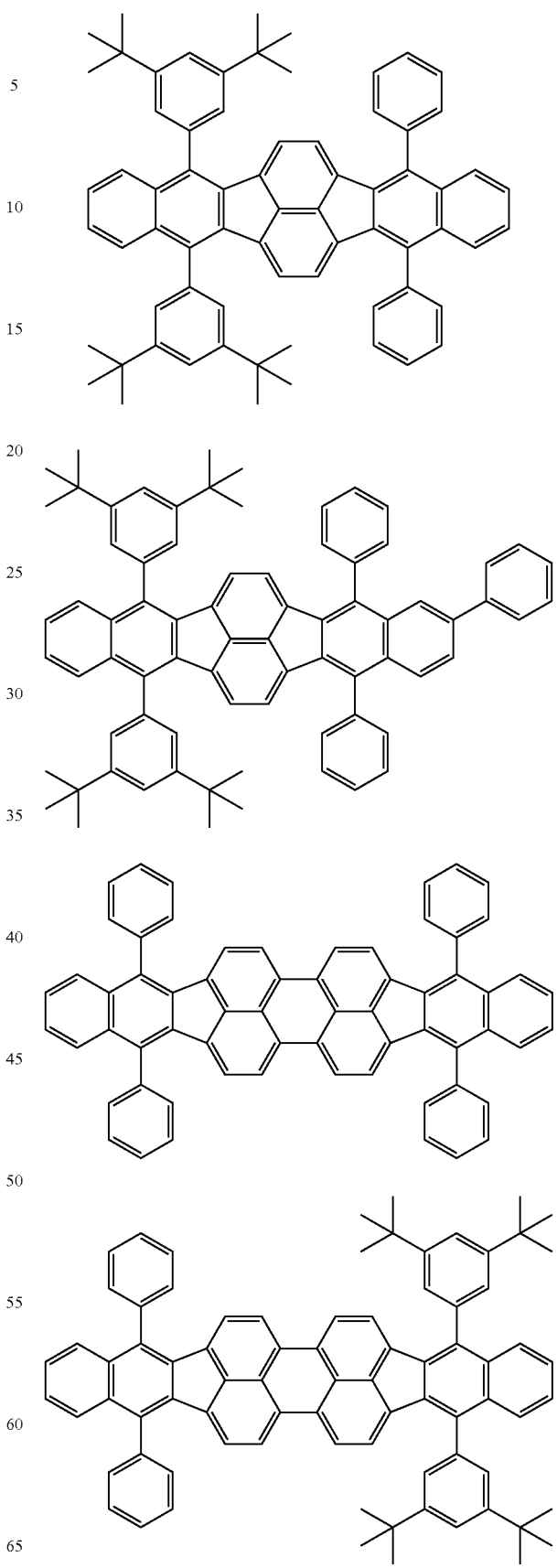

-continued

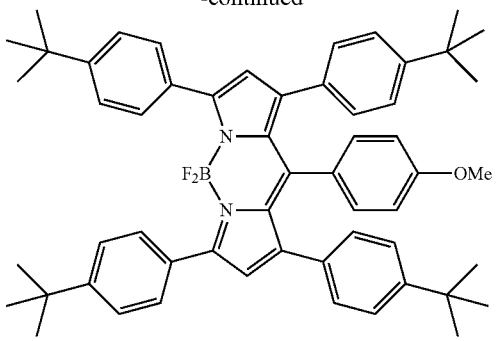

(3) Step of Forming Adjacent Functional Layer (FIG. 2C)

Next, an adjacent functional layer 14a is formed on the first light emitting layer 13a (FIG. 2C). In the present invention, the adjacent functional layer 14 is typically a layer provided on the light emitting layer (the first light emitting layer 13a) and adjacent to the light emitting layer. Examples of the adjacent functional layer 14 include a hole blocking layer and an electron blocking layer.

(4) Step of Forming Sacrificial Layer (FIG. 2C)

Next, a sacrificial layer 15 is formed on the adjacent functional layer 14a (FIG. 2C). The sacrificial layer 15 is provided so that a layer present on the sacrificial layer 15 (an intermediate layer 21) may be removed without a residue in a subsequent step. As a material for the sacrificial layer 15, a material soluble in a polar solvent is selected. When the material for the sacrificial layer 15 is selected to have higher solubility in a polar solvent than a material for the adjacent functional layer 14, the sacrificial layer 15 can be selectively removed, and thus, thickness variation of the adjacent functional layer 14 caused in the process can be suppressed. In other words, the accuracy in controlling the thickness of the adjacent functional layer 14 can be improved. In this manner, the material for the sacrificial layer 15 is selected to be a compound soluble in or having high solubility in a polar solvent, and specific examples include a heterocyclic compound and an organic compound having an electron-donating or electron-withdrawing substituent.

(5) Step of Forming Intermediate Layer (FIG. 2D)

Next, the intermediate layer 21 is formed on the sacrificial layer 15 (FIG. 2D). As a material for the intermediate layer 21, a material that has high solubility in a solvent in which the material for the sacrificial layer 15 has low solubility and does not damage the sacrificial layer 15, the adjacent functional layer 14a, the first light emitting layer 13a and the charge injection transport layer 12a in forming can be selected.

This means that an etching rate of the intermediate layer 21 in a specific solvent is set to be higher than that of the sacrificial layer 15 and the like. If, for example, a material minimally dissolved in water is used as the material for the sacrificial layer 15, water can be suitably used as a solution (a peeling solution) for dissolving the intermediate layer 21. Here, if water is selected as the peeling solution for the intermediate layer 21, a water-soluble inorganic material such as LiF or NaCl, or a water-soluble polymer such as polyvinyl alcohol (PVA) or polyvinyl pyrrolidone (PVP) can be used as the material for the intermediate layer 21.

(6) Step of Forming Protection Layer (FIG. 2E)

Next, a protection layer 22 is provided on the intermediate layer 21 (FIG. 2E). The protection layer 22 is provided for protecting, in forming a resist layer 23 described later, the intermediate layer 21 and the layers below the intermediate layer from a solvent used for dissolving a material for the resist layer 23. Furthermore, the range of selection of the material for the resist layer 23 can be expanded by providing the protection layer 22. An example of a material for the protection layer 22 includes an inorganic material with low permeability such as silicon nitride or silicon oxide.

(7) Step of Forming Resist Layer (FIG. 2F)

Next, the resist layer 23 is formed on the protection layer 22 (FIG. 2F). As a material for the resist layer 23, a known resist material can be used.

(8) Step of Processing First Organic Electroluminescent Layer (FIGS. 2G to 2I)

After forming the layers up to the resist layer as illustrated in FIG. 2F, a first organic electroluminescent layer is processed by the photolithography. Through procedures of FIGS. 2G to 2I, a first organic layered body 16a in which the charge injection transport layer 12a, the first light emitting layer 13a, the adjacent functional layer 14a, the sacrificial layer 15, the intermediate layer 21 and the protection layer 22 are stacked is processed.

First, the resist layer 23 is irradiated (exposed) with light and developed for processing the resist layer 23 so that the resist layer 23 may remain in a region where the first subpixel 2a is to be provided (FIG. 2G).

Then, by using the remaining resist layer 23 as a mask, portions of the protection layer 22, the intermediate layer 21, the sacrificial layer 15 and the adjacent functional layer 14a not covered by the resist layer 23 are successively removed by dry etching or wet etching (FIG. 2H). Incidentally, in processing by patterning the protection layer 22, the intermediate layer 21, the sacrificial layer 15 and the adjacent functional layer 14a, two or more layers may be simultaneously processed in one procedure or the respective layers may be individually processed in different procedures.

Next, the first light emitting layer 13a and the charge injection transport layer 12a are successively processed by the dry etching or the wet etching (FIG. 2I). Through this processing, a lower electrode 11b to be included in a second subpixel (B subpixel) 2b is exposed. Incidentally, although the resist layer 23 covering the first subpixel 2a remains in processing the first light emitting layer 13a and the charge injection transport layer 12a in FIG. 2I, the resist layer 23 may be removed during the procedures of FIGS. 2G to 2I. However, the resist layer 23 can preferably be removed in this step from the viewpoint that an impurity from the resist layer 23 can be prevented from entering the organic electroluminescent layer in a subsequent step (FIG. 2J).

(9) Step of Forming Second Organic Electroluminescent Layer (FIG. 2K)

Next, a charge injection transport layer 12b, a second light emitting layer 13b, an adjacent functional layer 14b and a sacrificial layer 15 are formed at least in a region where the second subpixel is to be formed (FIG. 2K). Although the charge injection transport layer 12b, the second light emitting layer 13b and the adjacent functional layer 14b are formed as a second organic electroluminescent layer in this embodiment, the second organic electroluminescent layer of the present invention is not limited to these layers. For example, the charge injection transport layer 12b may be omitted so as to form the second organic electroluminescent layer from the second light emitting layer 13b and the adjacent functional layer 14b.

Then, a sacrificial layer 15 is formed on the adjacent functional layer 14b (FIG. 2K). Here, for forming the adjacent functional layer 14b, the method described in the aforementioned item (3) can be employed. Furthermore, for forming the sacrificial layer 15, the method described in the aforementioned item (4) can be employed.

(10) Lift-Off Step (FIG. 2L)

Next, the intermediate layer 21 is brought into contact with a solution for dissolving the intermediate layer 21, so as to be dissolved therein, and thus, the layers provided on and above the intermediate layer 21 (the charge injection transport layer 12b, the second light emitting layer (the B light emitting layer) 13b, the adjacent functional layer 14b and the sacrificial layer 15) are removed (by lift-off) all together (FIG. 2L). The lift-off is performed specifically by dipping the substrate 10 in a solution for dissolving the intermediate layer 21. At this point, as the solution for dissolving the intermediate layer 21, a solvent having a higher etching rate for the intermediate layer 21 than for the sacrificial layer 15 is selected.

(11) Step of Removing Sacrificial Layer (FIG. 2M)

Although most portions of the intermediate layer 21 and the layers provided on and above the intermediate layer 21 are removed in the lift-off step, part of these layers may remain as a residue on the sacrificial layer 15 in some cases. Therefore, the sacrificial layer 15 is selectively removed by the wet etching. Thus, the residue remaining on the sacrificial layer 15 is removed together with the sacrificial layer 15 as illustrated in FIG. 2M.

Through the aforementioned procedures, layered bodies each including the charge injection transport layer (12a or 12b), the light emitting layer (13a or 13b) for outputting light corresponding to each subpixel and the adjacent functional layer (14a or 14b) are formed in a desired pattern shape in the respective subpixels (2a and 2b). If the number of kinds of subpixels is increased to further form an organic light emitting layer for outputting light corresponding to the increased subpixel, the procedures from the step of forming the intermediate layer (the step of the item (5) above) to the lift-off step (the step of the item (10) above) are appropriately repeated before removing the sacrificial layer.

(12) Step of Forming Common Layer (FIG. 2N)

Next, after sufficiently dehydrating the substrate, a common layer is formed (FIG. 2N). In the present invention, the common layer typically includes at least an upper electrode 19 that is an electrode commonly used by the respective subpixels. Furthermore, an interleaved layer such as a charge transport layer 17 or a charge injection layer 18 commonly used by the subpixels may be appropriately provided between the adjacent functional layer 14 and the upper electrode 19 in consideration of use of optical interference or the like.

A material for the upper electrode 19 is not especially limited as long as the material is a conductive material. For example, a metal material such as Al or Ag, or a transparent electrode material such as ITO or zinc oxide containing tin can be used. Alternatively, a layered electrode film including a layer of a metal material and a layer of a transparent conductive material can be used. Here, in order to externally output light emitted from the respective light emitting layers (13a and 13b), a material transparent or translucent to visible light is used for at least one of the lower electrode 11 and the upper electrode 19.

(13) Sealing Step

Ultimately, a sealing structure (not shown) for protecting the organic electroluminescent device from oxygen and moisture included in the air is provided, resulting in completing the organic electroluminescent apparatus. The procedures performed after removing the sacrificial layer and dehydrating the substrate can preferably be conducted under an environment in which the moisture amount in the atmosphere is restricted, such as under a vacuum or nitrogen atmosphere, so as to prevent re-adhesion of moisture. Examples of the sealing structure for the substrate include a constitution for covering the organic electroluminescent device by an inorganic protection layer with low permeability, and a constitution for covering the organic electroluminescent device by adhering a base material of glass, a metal or the like with low permeability onto the substrate 10 with a low permeable adhesive. Such an inorganic protection layer or a base material with low permeability correspond to "sealing member" in claims.

(With Regard to Ambient Light)

In the manufacturing process described so far, a part of the process from the formation of the charge injection transport layer 12a to the formation of the sealing structure is performed in the atmosphere. On this occasion, the organic electroluminescent layer constructing the first subpixel, more specifically, (at least any one of) the three layers of the charge injection transport layer 12a, the first light emitting layer 13a and the adjacent functional layer 14a may be exposed to the ambient light in some cases. Here, depending upon the light (the ambient light) to which the organic electroluminescent layer is exposed, it is apprehended that the first organic electroluminescent material (the organic compound having a fused ring structure including an anthracene skeleton) contained in the first organic electroluminescent layer may be degraded. Therefore, in the present embodiment, the range of the spectrum of the ambient light is appropriately restricted. In the processes illustrated in FIGS. 2A to 2N, steps in which there is a possibility that any one of the three layers of the charge injection transport layer 12a, the first light emitting layer 13a and the adjacent functional layer 14 may be exposed to the ambient light in the atmosphere are the steps illustrated in FIGS. 2B to 2N and transportation steps between these steps.

For example, if any one of the steps of successively forming the respective layers (12a, 13a and 14a) constructing the first organic electroluminescent layer (FIGS. 2B to 2C) is a step of forming a layer of a polymeric organic material by a coating method, the layer containing the first organic electroluminescent material may be exposed to the ambient light in the atmosphere. Alternatively, if the step of forming the intermediate layer 21 (FIG. 2D) is a step of coating a water-soluble polymer such as polyvinyl pyrrolidone (PVP), the respective layers (12a, 13a and 14a) constructing the first organic electroluminescent layer can be exposed to the ambient light in the atmosphere. In the lift-off step (FIG. 2K), the first organic electroluminescent layer can be exposed to the ambient light in the atmosphere in lifting off the intermediate layer 21 with water or the like. In the step of removing the sacrificial layer (FIG. 2L), the first organic electroluminescent layer can be exposed to the ambient light in the atmosphere during etching (FIG. 2M). Besides, the first organic electroluminescent layer can be exposed to the ambient light in the atmosphere also during transportation between the respective steps.

As described above, when an organic electroluminescent material having an anthracene skeleton is exposed to light with higher energy than the singlet excitation energy under an atmosphere containing oxygen, the organic electroluminescent material is degraded through photodimerization. Accordingly, after the step of forming the organic electroluminescent material having an anthracene skeleton, it is necessary to restrict at least one of oxygen contained in the atmosphere employed for every step and the spectrum of the ambient light. If the oxygen contained in the atmosphere is restricted, the oxygen concentration is controlled to be preferably 1000 ppm or less and more preferably 10 ppm or less. If the spectrum of the ambient light is restricted, a short wavelength edge of the spectrum of the ambient light can preferably be controlled to have a longer wavelength than an absorption spectral edge of the organic electroluminescent material having an anthracene skeleton.

In the present embodiment, the first organic electroluminescent layer is not exposed to light having higher energy than the singlet excitation energy of the first organic electroluminescent material in each of the steps performed in the atmosphere. Specifically, the ambient light is restricted to have a spectrum with a short wavelength edge having a longer wavelength than the absorption spectral edge of the fused ring compound having an anthracene skeleton (the first organic electroluminescent material). Thus, the fused ring compound having an anthracene skeleton does not cause singlet exciton by absorbing the ambient light. In other words, the photodimerization of the fused ring compound having an anthracene skeleton is prevented, so that degradation in the luminous efficiency and durability life of the organic electroluminescent device containing the compound can be suppressed.

Here, the control of the ambient light will be specifically described.

Figure 3:
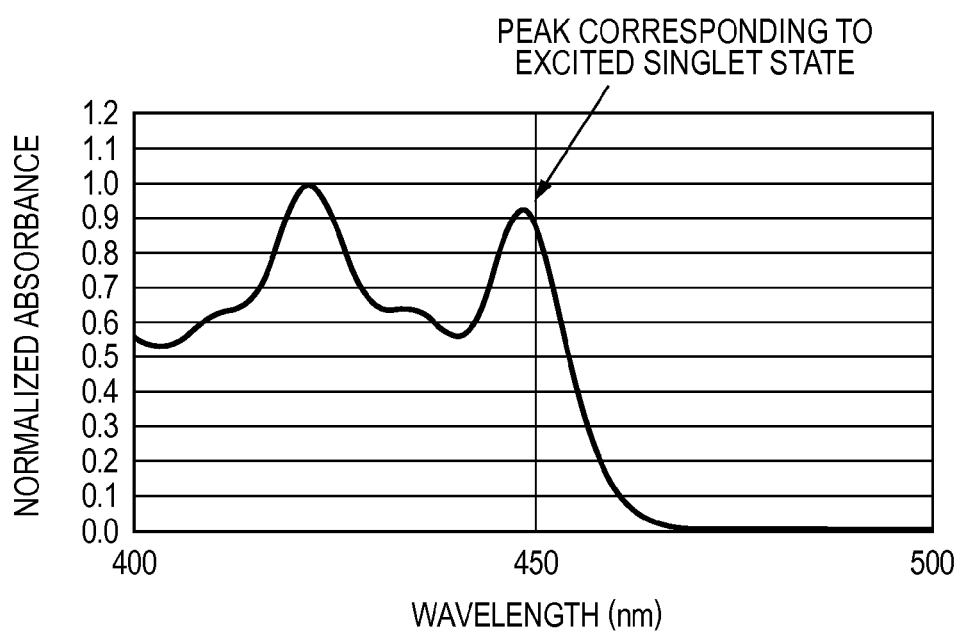
FIG. 3 is a diagram illustrating an absorption spectrum, in a solution, of a fused ring compound having an anthracene skeleton contained in a first light emitting layer.

FIG. 3 is a diagram illustrating an absorption spectrum in a solution of a fused ring compound having an anthracene skeleton contained in the first light emitting layer 13a, specifically, a compound represented by general formula (d). As illustrated in FIG. 3, the absorption spectrum has a peak derived from a singlet excited state of the objective compound in the vicinity of 450 nm. In the present embodiment, the ambient light is controlled so that the short wavelength edge of the spectrum may have lower energy than the singlet excitation energy of the fused ring compound having an anthracene skeleton. For example, as for the compound having the spectrum of FIG. 3, the ambient light is restricted to have a short wavelength edge of the spectrum on a longer wavelength side than the absorption edge of the peak present in the vicinity of 450 nm.

Similarly, the absorption spectrum of a compound represented by general formula (a) has a peak derived from the singlet excited state in the vicinity of 390 nm. Accordingly, if the compound of general formula (a) is used, the ambient light is restricted to have a short wavelength edge of the spectrum on a longer wavelength side than the absorption edge of the peak present in the vicinity of 390 nm.

Similarly, the absorption spectrum of a compound represented by general formula (b) has a peak derived from the singlet excited state in the vicinity of 420 nm. Accordingly, if the compound of general formula (b) is used, the ambient light is restricted to have a short wavelength edge of the spectrum on a longer wavelength side than the absorption edge of the peak present in the vicinity of 420 nm.

Similarly, the absorption spectrum of a compound represented by general formula (c) has a peak derived from the singlet excited state in the vicinity of 420 nm. Accordingly, if the compound of general formula (c) is used, the ambient light is restricted to have a short wavelength edge of the spectrum on a longer wavelength side than the absorption edge of the peak present in the vicinity of 420 nm.

Similarly, the absorption spectrum of a compound represented by general formula (e) has a peak derived from the singlet excited state in the vicinity of 410 nm. Accordingly, if the compound of general formula (e) is used, the ambient light is restricted to have a short wavelength edge of the spectrum on a longer wavelength side than the absorption edge of the peak present in the vicinity of 410 nm.

Similarly, the absorption spectrum of a compound represented by general formula (f) has a peak derived from the singlet excited state in the vicinity of 480 nm. Accordingly, if the compound of general formula (f) is used, the ambient light is restricted to have a short wavelength edge of the spectrum on a longer wavelength side than the absorption edge of the peak present in the vicinity of 480 nm.

Similarly, the absorption spectrum of a compound represented by general formula (g) has a peak derived from the singlet excited state in the vicinity of 530 nm. Accordingly, if the compound of general formula (g) is used, the ambient light is restricted to have a short wavelength edge of the spectrum on a longer wavelength side than the absorption edge of the peak present in the vicinity of 530 nm.

Figure 4:
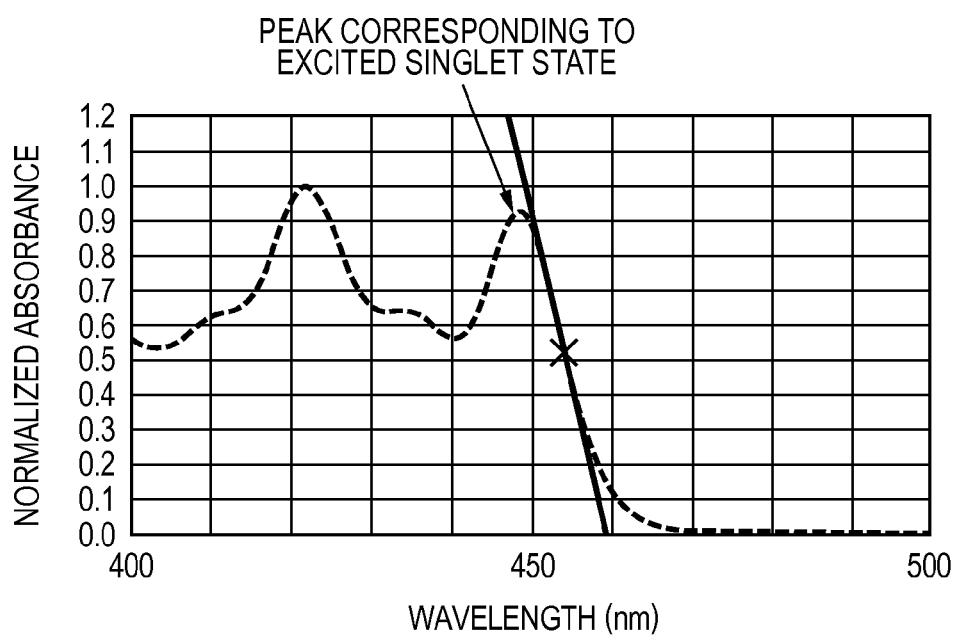
FIG. 4 is a diagram illustrating an absorption edge of a peak of the spectrum of FIG. 3.

Now, strict definition of an absorption edge of a peak will be described in detail. FIG. 4 is a diagram illustrating the absorption edge of the peak of the spectrum of FIG. 3. Referring to the spectrum of FIG. 3 as a specific example, the absorption edge of the peak of the objective compound corresponds to a point of intersection, with the X axis (where absorption intensity is 0), of a tangent line passing through an inflection point disposed on the longest wavelength side in the peak of the absorption spectrum derived from the singlet excited state as illustrated in FIG. 4. Based on the absorption edge of the peak obtained in this manner, light having a short wavelength edge of the spectrum on the longer wavelength side than this absorption edge of the peak may be used as the ambient light. Incidentally, the short wavelength edge of the spectrum of the ambient light refers to a wavelength at which intensity of 0.02% or less of the maximum intensity of the emission spectrum of the ambient light may be attained.

Figure 5:
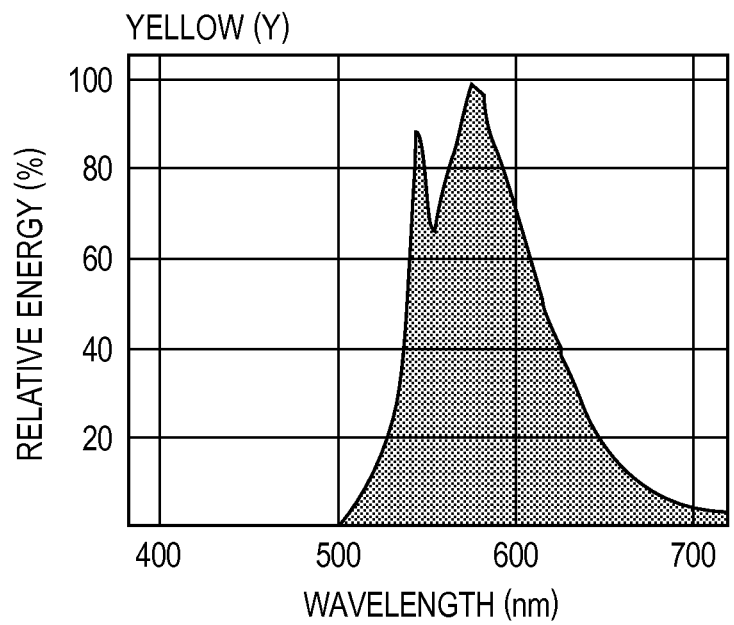
FIG. 5 is a diagram illustrating a spectral distribution of a commercially available yellow fluorescent lamp for use in a semiconductor manufacturing factory (FL40S Y-F manufactured by Hitachi, Ltd.).

If the compound having the spectrum illustrated in FIG. 3 is used, the spectrum of the ambient light can be restricted by using a commercially available yellow fluorescent lamp for use in a semiconductor manufacturing factory as a light source employed in the environment where the process is performed. FIG. 5 is a diagram illustrating a spectral distribution of a commercially available yellow fluorescent lamp for use in a semiconductor manufacturing factory (FL40SY-F manufactured by Hitachi Ltd.). It is understood from the spectral distribution of FIG. 5 that light of a wavelength shorter than 500 nm is cut by 99.98% or more in the objective fluorescent lamp. The light source of the ambient light is, however, not limited to the yellow fluorescent lamp for use in a semiconductor manufacturing factory. For example, apart from the yellow fluorescent lamp for use in a semiconductor manufacturing factory, various lightings such as a dark room lamp, an LED light source, an infrared light source and a sodium lamp can be used as a light source employed in the environment where the process is performed. Alternatively, a low-pass filter may be used in combination with any of various lightings. The yellow fluorescent lamp for use in a semiconductor manufacturing factory can be suitably used also when any of the compounds of general formulas (a) to (g) is used as the first organic electroluminescent material.

As described so far, by appropriately controlling the spectral range of the ambient light to which the organic electroluminescent layer may be exposed, the current luminous efficiency and the brightness durability characteristics of the organic electroluminescent device included in a specific subpixel can be improved.

Incidentally, if the second organic electroluminescent material additionally contained in the organic electroluminescent layer constructing the organic electroluminescent device is a compound having an absorption spectrum distributed on the longer wavelength side than the first organic electroluminescent material and having high triplet excitation energy, the ambient light is set as follows: The ambient light is selected or set so that the spectrum on the short wavelength side of the ambient light overlaps neither the absorption spectrum of the first organic electroluminescent material nor the absorption spectrum of the second organic electroluminescent material.

It is assumed, for example, that the following two compounds are respectively used as the first organic electroluminescent material and the second organic electroluminescent material.

First Organic Electroluminescent Material

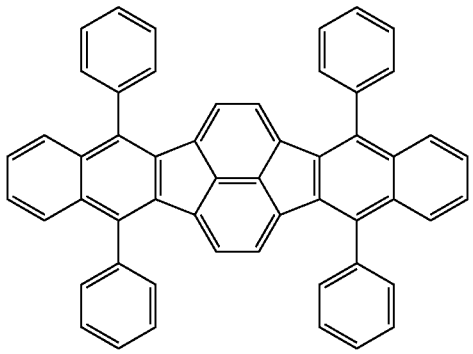

Second Organic Electroluminescent Material

Figure 6:
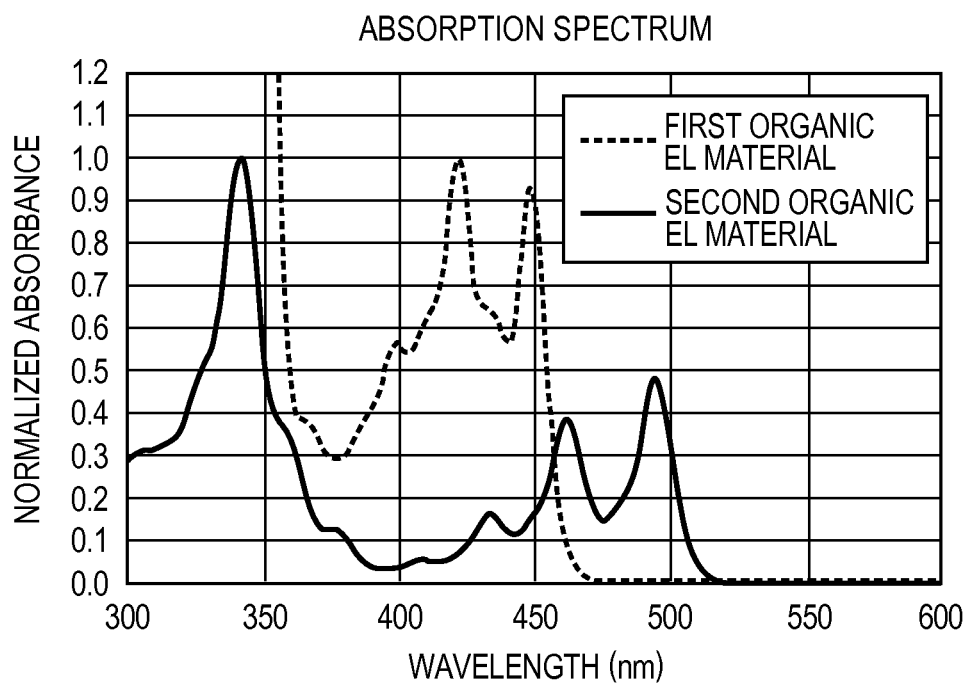
FIG. 6 is a diagram illustrating absorption spectra of a first organic electroluminescent material and a second organic electroluminescent material.

FIG. 6 is a diagram illustrating absorption spectra of the first organic electroluminescent material and the second organic electroluminescent material. As understood from FIG. 6, the absorption edge of the absorption spectrum of the second organic electroluminescent material is present on the longer wavelength side than that of the first organic electroluminescent material. Furthermore, the triplet excitation energy of the first organic electroluminescent material is 747.13 nm, and the triplet excitation energy of the second organic electroluminescent material is 655.21 nm. In this case, the ambient light may be set to have the emission spectrum on the longer wavelength side, so that the emission spectrum of the ambient light may overlap neither the absorption spectrum of the first organic electroluminescent material nor the absorption spectrum of the second organic electroluminescent material. In this manner, excitation of the second organic electroluminescent material otherwise caused by absorption of the ambient light and occurrence of energy transfer of the triplet excitation energy from the second organic electroluminescent material placed in triplet exciton to the first organic electroluminescent material can be prevented. Accordingly, the degradation of the first organic electroluminescent material, that is, the fused ring compound having an anthracene skeleton, caused through a reaction with the ambient light can be suppressed, and therefore, the current luminous efficiency and the brightness durability characteristics of the organic electroluminescent device included in the first subpixel (G subpixel) 2a can be improved.

EXAMPLES

The present invention will now be described in more detail with reference to examples. It is noted that the present invention is not limited to the example described below.

Example 1

Based on the manufacturing process illustrated in FIGS. 2A to 2N, an organic electroluminescent apparatus 1 including two kinds of subpixels (a first subpixel 2a and a second subpixel 2b) as illustrated in FIG. 1 was manufactured by a method described below. It is noted that the organic electroluminescent apparatus manufactured in this example (Example 1) is an organic electroluminescent apparatus having two kinds of subpixels, that is, a G subpixel for displaying green

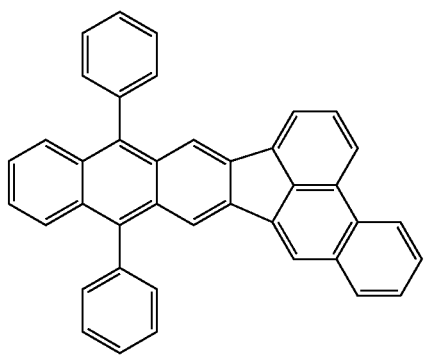 [SMILES: c1ccc(-c2c3ccccc3c(-c3ccccc3)c3cc4c(cc23)-c2cccc3c2c-4cc2ccccc23)cc1]

corresponding to the first subpixel 2a and a B subpixel for displaying blue corresponding to the second subpixel 2b.

(1) Step of Forming Lower Electrode (FIG. 2A)

First, a reflection film was formed on a substrate 10 by depositing silver by a vacuum evaporation method. At this point, the thickness of the reflection film was set to 120 nm. Next, a positive electrode was formed on the reflection film by depositing indium tin oxide. At this point, the thickness of the positive electrode was set to 60 nm. Subsequently, a layered electrode including the reflection film and the positive electrode stacked in this order was processed by the photolithography process, so as to form lower electrodes 11 (11a and 11b) in regions where a first subpixel 2a and a second subpixel 2b were respectively to be provided (FIG. 2A). Thereafter, as pre-processing for the lower electrodes 11, the substrate 10 was irradiated with UV for 10 minutes in a vacuum apparatus and then was subjected to a heat treatment.

(2) Step of Forming G Organic Electroluminescent Layer

Next, a hole transport layer (a charge injection transport layer 12), a first light emitting layer (a G light emitting layer) 13a, a hole blocking layer (an adjacent functional layer 14) and a sacrificial layer 15 were formed by a continuous vacuum evaporation process performed in the vacuum apparatus as described below. Incidentally, a layered body including the hole transport layer (the charge injection transport layer 12), the first light emitting layer 13a and the hole blocking layer (the adjacent functional layer 14) functions as a first organic electroluminescent layer (a G organic electroluminescent layer).

First, an organic material represented by the following formula was deposited on the lower electrodes 11, so as to form the hole transport layer (the charge injection transport layer 12). At this point, the thickness of the hole transport layer was set to 120 nm.

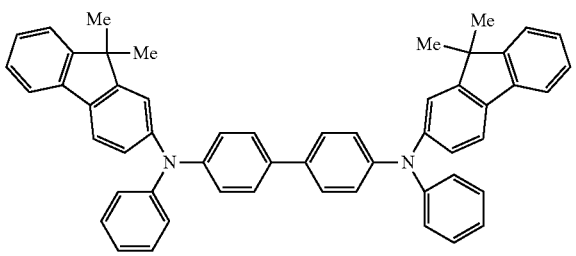 [SMILES: CC1(C)c2ccccc2-c2ccc(N(c3ccccc3)c3ccc(-c4ccc(N(c5ccccc5)c5ccc6c(c5)C(C)(C)c5ccccc5-6)cc4)cc3)cc21]

Next, three compounds respectively represented by the following formulas (i) to (iii) were codeposited on the hole transport layer, so as to form the first light emitting layer (the G light emitting layer) 13a. In this example, the compound of formula (i) corresponds to a first organic electroluminescent material, that is, a fused ring compound having an anthracene skeleton, and is contained as an assist material. The compound of formula (iii) corresponds to a second organic electroluminescent material having higher triplet excitation energy than the first organic electroluminescent material, and is contained as a light emitting material. At this point, the thickness of the first light emitting layer (the G light emitting layer) 13a was set to 20 nm.

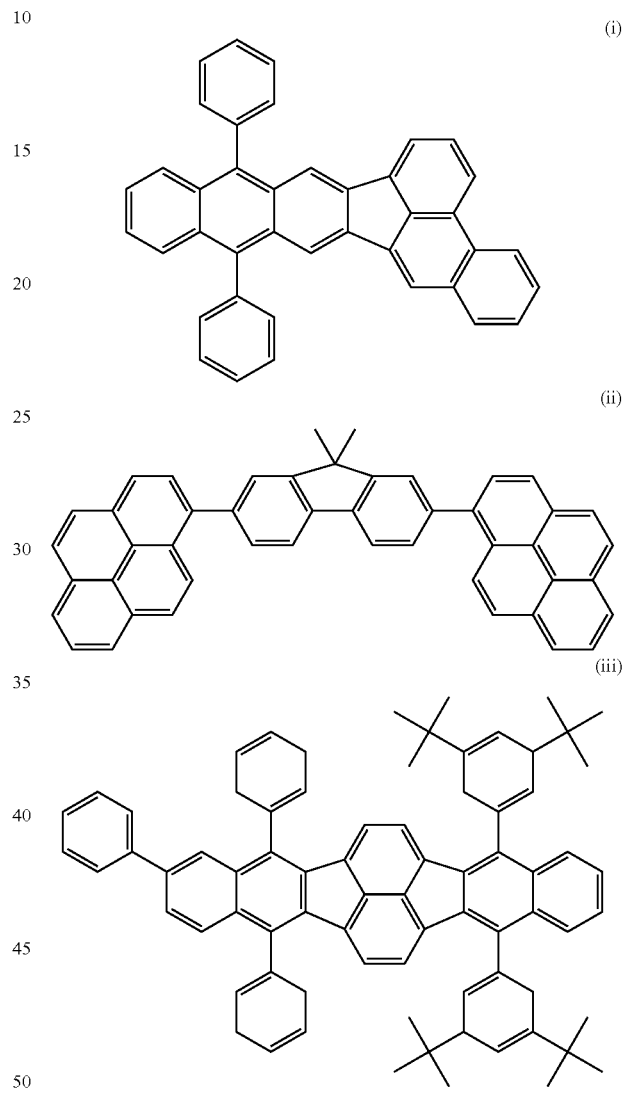

Next, an organic material represented by the following formula was deposited on the first light emitting layer (the G light emitting layer) 13a, so as to form the hole blocking layer (the adjacent functional layer 14). At this point, the thickness of the hole blocking layer was set to 10 nm.

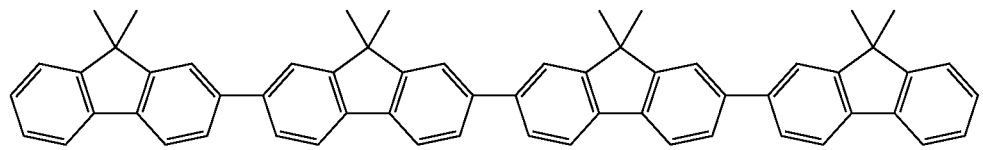 [SMILES: CC1(C)c2ccccc2-c2ccc(-c3ccc4c(c3)C(C)(C)c3cc(-c5ccc6c(c5)C(C)(C)c5cc(-c7ccc8c(c7)C(C)(C)c7ccccc7-8)ccc5-6)ccc3-4)cc21]

Next, an organic material represented by the following formula was deposited on the hole blocking layer, so as to form the sacrificial layer 15. At this point, the thickness of the sacrificial layer 15 was set to 40 nm.

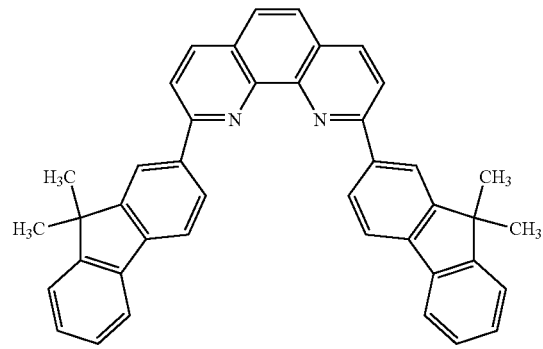

(3) Step of Forming Intermediate Layer

Next, the substrate 10 on which the layers up to the sacrificial layer 15 had been formed was taken out of the vacuum apparatus to a clean room. Here, the clean room had cleanliness of class 1000, the air environment therein was the same as the atmosphere, and every lighting therein was a yellow fluorescent lamp for use in a semiconductor manufacturing factory (FL40S Y-F, manufactured by Hitachi, Ltd.). When the substrate 10 was taken out to the clean room, the sacrificial layer 15 constituted the outermost surface, and the G organic electroluminescent layer was directly irradiated with light from the yellow fluorescent lamp for use in a semiconductor manufacturing factory in the atmosphere.

Next, after depositing PVP (polyvinyl pyrrolidone) on the sacrificial layer 15 by coating, the PVP was dried so as to form an intermediate layer 21.

(4) Step of Forming Protection Layer

Next, after the substrate 10 was returned to the vacuum apparatus, SiN (silicon nitride) was deposited on the intermediate layer 21 by the vacuum evaporation method, so as to form a protection layer 22. Incidentally, during transportation for returning the substrate 10 to the vacuum apparatus, the first organic electroluminescent layer (the G organic electroluminescent layer) was continuously irradiated with the light from the yellow fluorescent lamp for use in a semiconductor manufacturing factory in the atmosphere.

(5) Step of Processing Protection Layer

Next, the protection layer 22 was processed by patterning by the photolithography, so as to remain merely in a region where the G subpixel was to be provided. Specifically, the substrate 10 was first taken out of the vacuum apparatus to the clean room. As described above, the air environment in the clean room was the same as the atmosphere, and every lighting was the yellow fluorescent lamp for use in a semiconductor manufacturing factory.

Next, after applying HMDS (hexamethyl disilazane) onto the protection layer 22 for forming an HMDS layer, a positive photoresist was applied onto the HMDS layer with a spin coater, so as to form a resist layer 23. Subsequently, prebaking was carried out if necessary. Thereafter, exposure was performed by using a mask having an opening correspondingly to a region other than the region where the G subpixel 2a was to be provided, and then, development and post-baking were successively carried out. In this manner, the resist layer 23 patterned according to the region where the G subpixel 2a was to be provided was formed.

Next, dry etching was carried out with the patterned resist layer 23 used as a mask, so as to remove the protection layer 22, the intermediate layer 21, the sacrificial layer 15 and the first organic electroluminescent layer (the G organic electroluminescent layer) from the region other than the region where the first subpixel (G subpixel) 2a was to be provided. Specifically, the substrate 10 was first transported under the light from the yellow fluorescent lamp for use in a semiconductor manufacturing factory, and then, the substrate 10 was returned to the vacuum apparatus. Next, dry etching was carried out by using a carbon tetrafluoride gas ($CF_4$ gas), so as to remove a portion of the protection layer 22 not masked by the resist layer 23. Thereafter, dry etching was carried out with the thus patterned protection layer 22 used as a mask, so as to remove a portion of the intermediate layer 21 not masked by the protection layer 22. Subsequently, etching was carried out by using oxygen with the thus patterned intermediate layer used as a mask, so as to remove a portion of the sacrificial layer 15 and the first organic electroluminescent layer not masked by the intermediate layer 21. In this manner, the protection layer 22 remained merely in the region where the G subpixel 2a was to be provided, and the lower electrode 11 provided in a pixel other than the first subpixel 2a was exposed.

(6) Step of Forming B Organic Electroluminescent Layer

Next, after returning the substrate 10 to the vacuum apparatus, the exposed lower electrode 11 was subjected to preprocessing. Then, a hole transport layer, an electron blocking layer, a second light emitting layer (a B light emitting layer) 13b, a hole blocking layer (an adjacent functional layer 14b) and a sacrificial layer 15 were formed by a continuous vacuum evaporation process performed in the vacuum apparatus as described below. Incidentally, a layered body including the hole transport layer and the electron blocking layer functions as a charge injection transport layer 12, and a layered body including the charge injection transport layer 12, the second light emitting layer (the B light emitting layer) 13b and the hole blocking layer (the adjacent functional layer 14) functions as a B organic electroluminescent layer.

First, an organic material represented by the following formula was deposited on the lower electrode 11, so as to form the hole transport layer. At this point, the thickness of the hole transport layer was set to 60 nm.

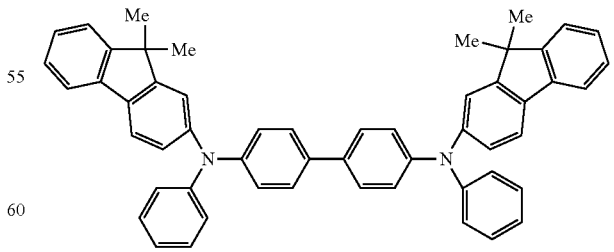

Next, a compound represented by the following formula was deposited on the hole transport layer, so as to form the electron blocking layer. At this point, the thickness of the electron blocking layer was set to 10 nm.

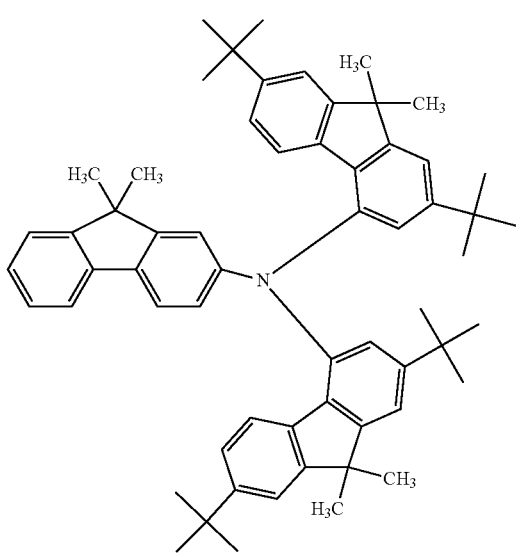 [SMILES: CC(C)(C)c1ccc2c(c1)C(C)(C)c1cc(C(C)(C)C)cc(N(c3ccc4c(c3)C(C)(C)c3ccccc3-4)c3cc(C(C)(C)C)cc4c3-c3ccc(C(C)(C)C)cc3C4(C)C)c1-2]

Next, two compounds respectively represented by the following formulas were codeposited on the electron blocking layer, so as to form the second light emitting layer (the B light emitting layer) 13b. At this point, the thickness of the second light emitting layer (the B light emitting layer) 13b was set to 20 nm. In this example, the second light emitting layer (the B light emitting layer) 13b contains neither the first organic electroluminescent material nor the second organic electroluminescent material having higher triplet excitation energy than the first organic electroluminescent material.

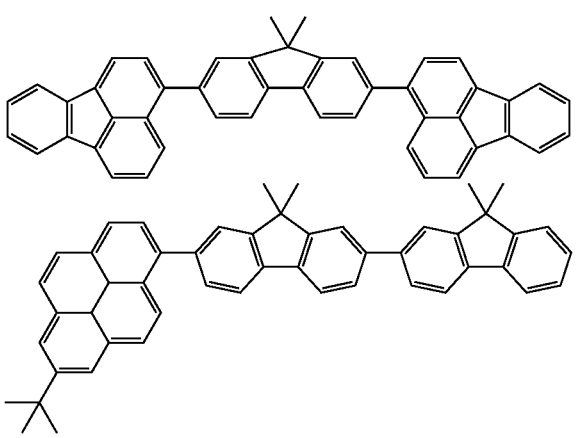

Next, an organic material represented by the following formula was deposited on the second light emitting layer (the B light emitting layer) 13b, so as to form the hole blocking layer (the adjacent functional layer 14). At this point, the thickness of the hole blocking layer was set to 10 nm.

Next, an organic material represented by the following formula was deposited on the hole blocking layer, so as to form the sacrificial layer 15. At this point, the thickness of the sacrificial layer 15 was set to 40 nm.

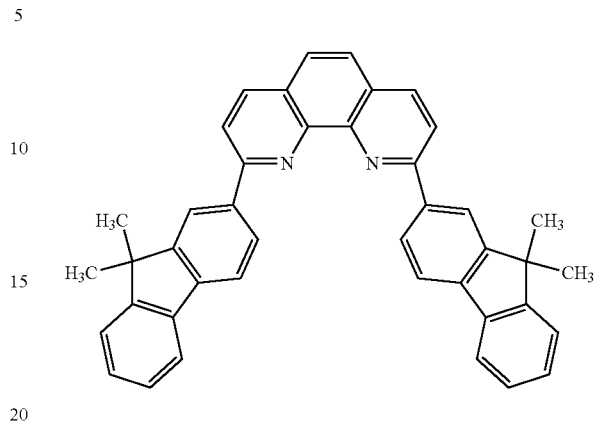

(7) Lift-Off Step

Subsequently, the substrate 10 was taken out of the vacuum apparatus to a room lighted merely by the yellow fluorescent lamp for use in a semiconductor manufacturing factory. Next, the substrate 10 taken out was dipped in water. At this point, since the PVP used as the material for the intermediate layer 21 is water-soluble, the intermediate layer was dissolved when dipped in water, and accordingly, the protection layer 22 was also removed together with the intermediate layer 21. Incidentally, in this step, the first organic electroluminescent layer (the G organic electroluminescent layer) and the second organic electroluminescent layer (the B organic electroluminescent layer) were irradiated with the light from the yellow fluorescent lamp for use in a semiconductor manufacturing factory in the atmosphere with the sacrificial layer 15 constituting on the outermost surface.

(8) Step of Removing Sacrificial Layer

Next, the substrate 10 was dipped in isopropyl alcohol, so as to remove the sacrificial layer 15 provided in the G subpixel 2a and the B subpixel 2b. At this point, the first organic electroluminescent layer (the G organic electroluminescent layer) and the second organic electroluminescent layer (the B organic electroluminescent layer) were irradiated with the light from the yellow fluorescent lamp for use in a semiconductor manufacturing factory in the atmosphere with the hole blocking layer (the adjacent functional layer 14) constituting the outermost surface.

Subsequently, in order to remove moisture adhered on the top surface or the side surfaces of a layered body including the charge injection transport layer 12, the light emitting layers (13a and 13b) and the adjacent functional layer 14, the substrate 10 was transported into a vacuum apparatus and then was baked at 100° C. The transportation of the substrate into the vacuum apparatus after removing the sacrificial layer was performed in the atmosphere and under the light from the yellow fluorescent lamp for use in a semiconductor manufacturing factory.

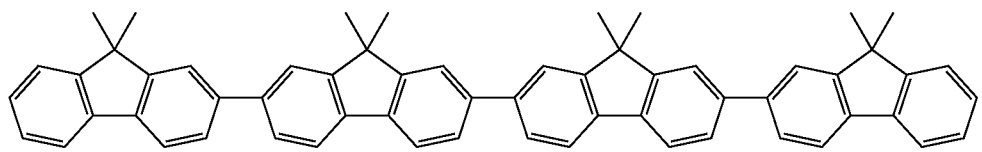 [SMILES: CC1(C)c2ccccc2-c2ccc(-c3ccc4c(c3)C(C)(C)c3cc(-c5ccc6c(c5)C(C)(C)c5cc(-c7ccc8c(c7)C(C)(C)c7ccccc7-8)ccc5-6)ccc3-4)cc21]

(9) Step of Forming Common Layers

Next, an electron transport layer, an electron injection layer and an upper electrode commonly used by the respective subpixels were formed by a continuous vacuum evaporation process performed in the vacuum apparatus.

First, an organic material represented by the following formula was deposited into a thickness of 10 nm on the hole blocking layer (the adjacent functional layer 14), so as to form the electron transport layer 17. Thereafter, the organic material represented by the following formula and cesium carbonate were codeposited, so as to form the electron injection layer 18. At this point, the thickness of the electron injection layer 18 was set to 20 nm.

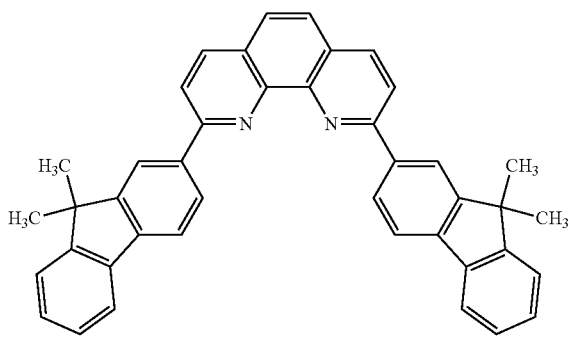

Next, silver was deposited on the electron injection layer 18 by sputtering, so as to form the upper electrode 19. At this point, the thickness of the upper electrode 19 was set to 12 nm.

(10) Sealing Step

Ultimately, the organic electroluminescent apparatus was sealed by using a cap glass within a glove box filled with nitrogen. The transportation of the substrate 10 from the vacuum apparatus to the glove box after forming the upper electrode was continuously performed within an apparatus having an atmosphere in which the moisture was restricted. In this manner, the organic electroluminescent apparatus was obtained.

(11) Evaluation of Apparatus

The thus obtained apparatus was evaluated for light emitting characteristics (luminous efficiency and durability) of the G subpixel 2a by known methods as follows:

(11-1) Luminous Efficiency

The luminous efficiency at $CIE_x$ of 0.230 was measured.

(11-2) Durability

The organic electroluminescent apparatus was continuously operated at room temperature, and time elapsed when brightness was lowered from initial brightness (brightness at 100% level) to brightness at 98.5% level was measured.

The results of the measurements are listed in Table 1.

Comparative Example 1

An organic electroluminescent apparatus was manufactured in the same manner as in Example 1 except that a white fluorescent lamp was used instead of the yellow fluorescent lamp for use in a semiconductor manufacturing factory used in Example 1. Incidentally, in this comparative example (Comparative Example 1), the first organic electroluminescent layer (G organic electroluminescent layer) was exposed to the atmosphere and irradiated directly with white light emitted from the white fluorescent lamp in steps corresponding to the steps described in the items (3), (5), (7) and (8) of Example 1.

The thus manufactured apparatus was evaluated for the light emitting characteristics (luminous efficiency and durability) of a G subpixel 2a in the same manner as in Example 1. The results are listed in Table 1.

TABLE 1

| | Ambient light | Durability [time] | Luminous efficiency [cd/A] |
|---|---|---|---|
| Example 1 | Yellow fluorescent lamp for use in semiconductor manufacturing factory | 96 | 37 |
| Comparative Example 1 | White fluorescent lamp | 2 | 9 |

Table 1 shows comparison in the luminous efficiency and durability of the G subpixel 2a between Example 1 and Comparative Example 1. As shown in Table 1, if the white fluorescent lamp is used as the ambient light in the processing of the organic electroluminescent layer by the photolithography process, the luminous efficiency and the durability of the G subpixel 2a are largely degraded as compared with the case where the yellow fluorescent lamp for use in a semiconductor manufacturing factory is used.

As described above, the organic electroluminescent apparatus of the present invention contains a fused ring compound having an anthracene skeleton as one of materials for an organic electroluminescent device constructing the organic electroluminescent apparatus. Furthermore, the photolithography can be employed in the manufacturing method of the present invention, and for example, the range of the wavelength of the ambient light to which the fused ring compound having an anthracene skeleton is exposed during the process is restricted to a prescribed range. Specifically, the ambient light is restricted to have a spectrum having a short wavelength edge with lower energy than singlet excitation energy of the fused ring compound having an anthracene skeleton (the first organic electroluminescent material). In this manner, the fused ring compound having an anthracene skeleton never absorbs the ambient light and hence is never excited. Since the excitation is not caused, photodimerization that may otherwise degrade the fused ring compound having an anthracene skeleton can be avoided.

Accordingly, when the manufacturing method of the present invention is employed, an organic electroluminescent apparatus having high definition, high efficiency and a long life can be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-147950, filed on Jun. 29, 2012 which is hereby incorporated by reference herein in its entirety.

What is claimed is:

1. A method for manufacturing an organic electroluminescent apparatus that includes, on a substrate, a plurality of organic electroluminescent devices each including a first electrode, a second electrode and an organic electroluminescent layer sandwiched between the first electrode and the second electrode and containing a fused ring compound having an anthracene skeleton, with the organic electroluminescent devices covered by a sealing member, comprising, in the following order:

forming the organic electroluminescent layer on the substrate on which the first electrode has been formed;

processing the organic electroluminescent layer;

forming the second electrode on the organic electroluminescent layer; and providing the sealing member covering the organic electroluminescent layer, wherein the organic electroluminescent layer is not exposed to an environment containing oxygen and including light of a wavelength shorter than a wavelength of a long wavelength edge of an absorption spectrum of the fused ring compound having an anthracene skeleton from forming the organic electroluminescent layer until completion of providing the sealing member.

2. The method for manufacturing an organic electroluminescent apparatus according to claim 1, wherein the method is performed under light of a wavelength region longer than the wavelength of the long wavelength edge of the absorption spectrum of the fused ring compound having an anthracene skeleton from forming the organic electroluminescent layer until providing the sealing member.

3. The method for manufacturing an organic electroluminescent apparatus according to claim 1, wherein a light emitting layer included in the organic electroluminescent layer contains the fused ring compound having an anthracene skeleton.

4. The method for manufacturing an organic electroluminescent apparatus according to claim 1, wherein the organic electroluminescent layer further contains an organic compound material not having an anthracene skeleton, and the organic electroluminescent layer is not exposed either to light of a wavelength shorter than a wavelength of a long wavelength edge of an absorption spectrum of the organic compound material not having an anthracene skeleton from forming the organic electroluminescent layer until providing the sealing member.

5. The method for manufacturing an organic electroluminescent apparatus according to claim 1, further comprising, before forming the organic electroluminescent layer:

providing an intermediate layer made of a water-soluble material; and removing a part of the intermediate layer, wherein the processing the organic electroluminescent layer includes removing the organic electroluminescent layer formed on the intermediate layer by dissolving the intermediate layer.

6. The method for manufacturing an organic electroluminescent apparatus according to claim 5, wherein the processing the organic electroluminescent layer is carried out under light of a wavelength region longer than the wavelength of the long wavelength edge of the absorption spectrum of the fused ring compound having an anthracene skeleton.

7. The method for manufacturing an organic electroluminescent apparatus according to claim 5, wherein the removing a part of the intermediate layer includes:

forming a photoresist layer on the intermediate layer;

patterning the photoresist layer by photolithography; and removing the intermediate layer by using the patterned photoresist layer as a mask.

8. The method for manufacturing an organic electroluminescent apparatus according to claim 7, further comprising:

forming a protection layer of an inorganic material on the intermediate layer before forming the photoresist layer; and removing the protection layer by using the photoresist layer as a mask before removing the intermediate layer.

9. A method for manufacturing an organic electroluminescent apparatus including, on a substrate, a plurality of organic electroluminescent devices each including a first electrode, a second electrode and an organic electroluminescent layer sandwiched between the first electrode and the second electrode and containing a fused ring compound having an anthracene skeleton, with the organic electroluminescent devices covered by a sealing member, comprising:

forming the organic electroluminescent layer on the substrate on which the first electrode has been formed;

processing the organic electroluminescent layer;

forming the second electrode on the organic electroluminescent layer; and providing the sealing member covering the organic electroluminescent layer, wherein a process carried out under an environment in which oxygen is contained and the organic electroluminescent layer is exposed to ambient light is performed between the forming the organic electroluminescent layer and the providing the sealing member, and a wavelength of a short wavelength edge of a spectrum of the ambient light is longer than a wavelength of a long wavelength edge of an absorption spectrum of the fused ring compound having an anthracene skeleton.

10. The method for manufacturing an organic electroluminescent apparatus according to claim 9, wherein the fused ring compound having an anthracene skeleton is any one of compounds represented by the following general formulas (a) to (g), and a light source of the ambient light is a yellow fluorescent lamp:

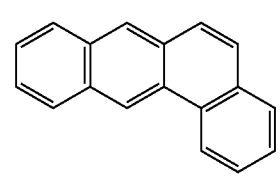

(a)

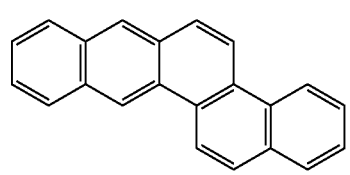

(b)

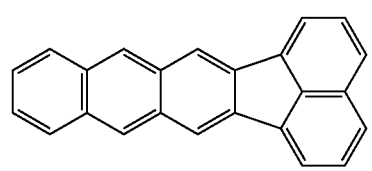

(c)

(d)
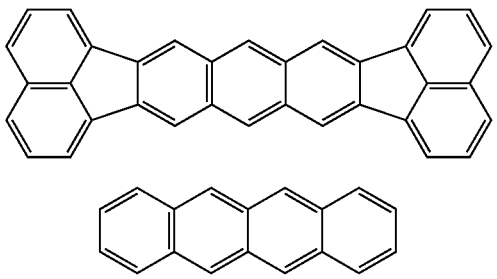
(f)
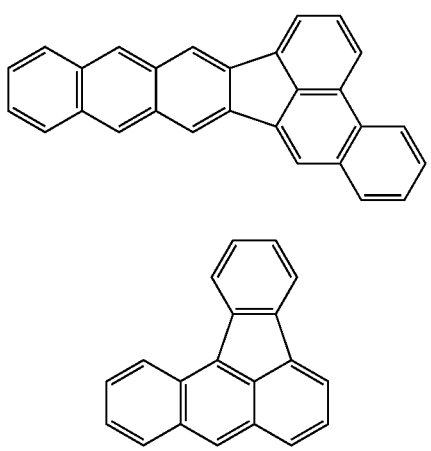
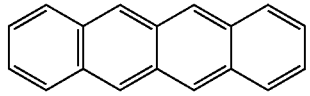
(g)
(e)
wherein, in general formulas (a) to (g), a hydrogen atom may be substituted with any one of a fluorine atom, a chlorine atom, a bromine atom, an iodine atom, an alkyl group having 1 to 20 carbon atoms, a substituted amino group, an aryl group that may have a substituent and a heterocyclic group that may have a substituent.
\* \* \* \* \*